United States Patent
Nair et al.

(10) Patent No.: US 11,114,363 B2
(45) Date of Patent: Sep. 7, 2021

(54) ELECTRONIC PACKAGE ARRANGEMENTS AND RELATED METHODS

(71) Applicant: Qorvo US, Inc., Greensboro, NC (US)

(72) Inventors: Deepukumar M. Nair, Lake Mary, FL (US); Robert Charles Dry, Plano, TX (US); Jeffrey Dekosky, Winter Garden, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/579,080

(22) Filed: Sep. 23, 2019

(65) Prior Publication Data

US 2020/0203248 A1    Jun. 25, 2020

Related U.S. Application Data

(60) Provisional application No. 62/782,373, filed on Dec. 20, 2018.

(51) Int. Cl.
  *H01L 23/367* (2006.01)
  *H01L 23/31* (2006.01)
  (Continued)

(52) U.S. Cl.
  CPC ...... *H01L 23/3675* (2013.01); *H01L 21/4882* (2013.01); *H01L 21/565* (2013.01); *H01L 23/3121* (2013.01); *H01L 23/552* (2013.01)

(58) Field of Classification Search
  CPC combination set(s) only.
  See application file for complete search history.

(56) References Cited

U.S. PATENT DOCUMENTS 3,566,190 A   2/1971  Huebner et al.
3,907,616 A   9/1975  Wiemer
(Continued)

FOREIGN PATENT DOCUMENTS

CN   1855451 A    11/2006
EP   1715520 B1   10/2006
(Continued)

OTHER PUBLICATIONS

Hearing Notice for Indian Patent Application No. 8469/DELNP/2009, mailed Dec. 26, 2019, 3 pages.
(Continued)

*Primary Examiner* — Mamadou L Diallo
(74) *Attorney, Agent, or Firm* — Withrow & Terranova, PLLC

(57) ABSTRACT

Electronic package arrangements and related methods are disclosed that provide one or more of improved thermal management and electromagnetic shielding. Electronic packages are disclosed that include arrangements of one or more electronic devices, overmold bodies, and heat spreaders or metal frame structures. The heat spreaders or metal frame structures may be arranged over the electronic devices to form heat dissipation paths that draw operating heat away from the electronic devices in one or more directions including above and below the electronic packages. The heat spreaders or metal frame structures may also be arranged to form electromagnetic shields that reduce crosstalk between the electronic devices within the electronic packages and to suppress unwanted emissions from either escaping or entering the electronic packages.

23 Claims, 7 Drawing Sheets

(51) Int. Cl.
  *H01L 21/56* (2006.01)
  *H01L 21/48* (2006.01)
  *H01L 23/552* (2006.01)

(56) References Cited

U.S. PATENT DOCUMENTS

| | | | |
|---|---|---|---|
| 3,907,617 A | 9/1975 | Zwernemann | |
| 4,680,676 A | 7/1987 | Petratos et al. | |
| 5,329,695 A | 7/1994 | Traskos et al. | |
| 5,389,738 A | 2/1995 | Piosenka et al. | |
| 5,406,630 A | 4/1995 | Piosenka et al. | |
| 5,436,203 A | 7/1995 | Lin | |
| 5,459,368 A | 10/1995 | Onishi et al. | |
| 5,473,512 A | 12/1995 | Degani et al. | |
| 5,592,391 A | 1/1997 | Muyshondt et al. | |
| 5,623,293 A | 4/1997 | Aoki | |
| 5,639,989 A | 6/1997 | Higgins, III | |
| 5,646,828 A | 7/1997 | Degani et al. | |
| 5,650,659 A | 7/1997 | Mostafazadeh et al. | |
| 5,870,289 A | 2/1999 | Tokuda et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,429,386 B2 | 8/2002 | DiBene, II et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,515,870 B1 | 2/2003 | Skinner et al. | |
| 6,534,859 B1 | 3/2003 | Shim et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,894,229 B1 | 5/2005 | Cheah | |
| 6,900,383 B2 | 5/2005 | Babb et al. | |
| 6,946,324 B1 | 9/2005 | McLellan et al. | |
| 6,947,295 B2 | 9/2005 | Hsieh | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,087,461 B2 | 8/2006 | Park et al. | |
| 7,087,462 B1 | 8/2006 | Park et al. | |
| 7,109,410 B2 | 9/2006 | Arnold et al. | |
| 7,109,817 B2 | 9/2006 | Kolb et al. | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,330,084 B2 | 2/2008 | Lee et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 | 6/2009 | Huemoeller et al. | |
| 7,598,606 B2 | 10/2009 | Chow et al. | |
| 7,633,170 B2 | 12/2009 | Yang et al. | |
| 7,633,765 B1 | 12/2009 | Scanlan et al. | |
| 7,635,918 B2 | 12/2009 | Yoshida | |
| 7,636,245 B2 | 12/2009 | Clancy et al. | |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,701,728 B2 | 4/2010 | Hatanaka et al. | |
| 7,745,910 B1 | 6/2010 | Olson et al. | |
| 7,772,046 B2 | 8/2010 | Pagaila et al. | |
| 7,829,981 B2 | 11/2010 | Hsu | |
| 7,902,643 B2 | 3/2011 | Tuttle | |
| 7,902,644 B2 | 3/2011 | Huang et al. | |
| 7,928,538 B2 | 4/2011 | Salzman | |
| 7,989,928 B2 | 8/2011 | Liao et al. | |
| 8,013,258 B2 | 9/2011 | Wu | |
| 8,053,872 B1 | 11/2011 | Swan et al. | |
| 8,061,012 B2 | 11/2011 | Carey et al. | |
| 8,062,930 B2 | 11/2011 | Shah et al. | |
| 8,071,431 B2 | 12/2011 | Hoang et al. | |
| 8,084,300 B1 | 12/2011 | San Antonio et al. | |
| 8,093,690 B2 | 1/2012 | Ko et al. | |
| 8,093,691 B1 | 1/2012 | Fuentes et al. | |
| 8,110,441 B2 | 2/2012 | Chandra et al. | |
| 8,186,048 B2 | 5/2012 | Leahy et al. | |
| 8,220,145 B2 | 7/2012 | Hiner et al. | |
| 8,268,677 B1 | 9/2012 | Pagaila | |
| 8,296,938 B2 | 10/2012 | Carey et al. | |
| 8,296,941 B2 | 10/2012 | Hiner et al. | |
| 8,349,659 B1 | 1/2013 | Swan et al. | |
| 8,359,739 B2 | 1/2013 | Carey et al. | |
| 8,373,264 B2 | 2/2013 | Welch et al. | |
| 8,409,658 B2 | 4/2013 | Hiner et al. | |
| 8,410,584 B2 | 4/2013 | An et al. | |
| 8,434,220 B2 | 5/2013 | Rao et al. | |
| 8,507,319 B2 | 8/2013 | Chow et al. | |
| 8,552,539 B1 | 10/2013 | Foster | |
| 8,614,899 B2 | 12/2013 | Madsen et al. | |
| 8,664,774 B1 | 3/2014 | Mosinskis | |
| 8,720,051 B2 | 5/2014 | Leahy et al. | |
| 8,748,230 B2 | 6/2014 | Welch et al. | |
| 8,835,226 B2 | 9/2014 | Morris et al. | |
| 8,861,221 B2 | 10/2014 | Pagaila | |
| 8,959,762 B2 | 2/2015 | Leahy et al. | |
| 8,987,889 B2 | 3/2015 | Welch et al. | |
| 9,048,020 B2 | 6/2015 | Calvillo Cortes et al. | |
| 9,137,934 B2 | 9/2015 | Morris et al. | |
| 9,450,547 B2 | 9/2016 | Szymanowski et al. | |
| 9,589,927 B2 | 3/2017 | Szymanowski et al. | |
| 9,627,230 B2 | 4/2017 | Carey et al. | |
| 9,661,739 B2 | 5/2017 | Leahy et al. | |
| 9,935,075 B2 | 4/2018 | Huang et al. | |
| 9,978,691 B2 | 5/2018 | Kuo et al. | |
| 2002/0036345 A1 | 3/2002 | Iseki et al. | |
| 2002/0118529 A1 | 8/2002 | Babin et al. | |
| 2002/0142516 A1 | 10/2002 | Light | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0090883 A1 | 5/2003 | Asahi et al. | |
| 2003/0151122 A1 | 8/2003 | Davies | |
| 2004/0063246 A1 | 4/2004 | Karnezos | |
| 2004/0103509 A1 | 6/2004 | Bidard et al. | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0222511 A1 | 11/2004 | Zhang | |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0113642 A1 | 6/2006 | Kajiki et al. | |
| 2006/0119448 A1 | 6/2006 | Lee et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |

(56) References Cited

U.S. PATENT DOCUMENTS

| | | |
|---|---|---|
| 2006/0266547 A1 | 11/2006 | Koga |
| 2006/0273467 A1* | 12/2006 | Brandenburg ........ H01L 21/565 257/778 |
| 2006/0273813 A1 | 12/2006 | Coffy |
| 2006/0274517 A1 | 12/2006 | Coffy |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1 | 7/2007 | Karnezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0067645 A1* | 3/2008 | Foong ..................... H01L 23/42 257/675 |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0067149 A1 | 3/2009 | Bogursky et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0052125 A1 | 3/2010 | Sasaki et al. |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0003435 A1 | 1/2011 | Tang et al. |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084368 A1 | 4/2011 | Hoang et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298110 A1 | 12/2011 | Pagaila et al. |
| 2011/0298670 A1 | 12/2011 | Jung et al. |
| 2011/0316657 A1 | 12/2011 | Park et al. |
| 2012/0002377 A1 | 1/2012 | French et al. |
| 2012/0025356 A1 | 2/2012 | Liao et al. |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0139640 A1 | 6/2012 | Calvillo Cortes et al. |
| 2012/0182706 A1 | 7/2012 | Siomkos et al. |
| 2012/0217048 A1 | 8/2012 | Leahy et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2012/0286415 A1 | 11/2012 | Sakai et al. |
| 2013/0324069 A1 | 12/2013 | Chen et al. |
| 2014/0077349 A1* | 3/2014 | Higgins, III ............ H01L 24/13 257/692 |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0307394 A1 | 10/2014 | Lobianco et al. |
| 2014/0340859 A1 | 11/2014 | Morris et al. |
| 2014/0353807 A1 | 12/2014 | Welch |
| 2014/0355222 A1 | 12/2014 | Dang et al. |
| 2015/0091157 A9 | 4/2015 | Chi et al. |
| 2015/0124421 A1 | 5/2015 | Leahy et al. |
| 2015/0170986 A1 | 6/2015 | Szymanowski et al. |
| 2015/0296631 A1 | 10/2015 | Morris et al. |
| 2016/0087588 A1 | 3/2016 | Szymanowski et al. |
| 2016/0148882 A1 | 5/2016 | Kim et al. |
| 2016/0211222 A1 | 7/2016 | Kuo et al. |
| 2017/0117230 A1 | 4/2017 | Kumbhat et al. |
| 2017/0118877 A1 | 4/2017 | Kumbhat et al. |
| 2017/0127581 A1 | 5/2017 | Figueredo et al. |
| 2017/0133326 A1 | 5/2017 | Dang et al. |
| 2017/0194281 A1 | 7/2017 | DeLaCruz et al. |
| 2018/0033764 A1 | 2/2018 | Huang et al. |
| 2018/0130755 A1 | 5/2018 | Lee et al. |
| 2019/0371738 A1 | 12/2019 | Morris et al. |
| 2020/0008327 A1 | 1/2020 | Lear et al. |

FOREIGN PATENT DOCUMENTS

| | | |
|---|---|---|
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| JP | 2011523120 A | 8/2011 |
| JP | 5254446 B2 | 8/2013 |
| KR | 20060113412 A | 11/2006 |
| TW | 201108360 A | 3/2011 |
| TW | 201142965 A | 12/2011 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009099699 A1 | 8/2009 |
| WO | 2009144960 A1 | 12/2009 |
| WO | 2010014103 A1 | 2/2010 |
| WO | 2010021262 A1 | 2/2010 |

OTHER PUBLICATIONS

Notice of Allowance for U.S. Appl. No. 16/390,761, dated Mar. 24, 2020, 7 pages.

Notice of Allowance for U.S. Appl. No. 11/952,690, dated Aug. 30, 2010, 9 pages.

Non-Final Office Action for U.S. Appl. No. 11/952,690, dated Mar. 25, 2010, 9 pages.

Non-Final Rejection for U.S. Appl. No. 12/913,364, dated Feb. 13, 2012, 6 pages.

Notice of Allowance for U.S. Appl. No. 12/913,364, dated Jun. 8, 2012, 8 pages.

(56) References Cited

OTHER PUBLICATIONS

Non-Final Office Action for U.S. Appl. No. 13/189,838, dated Mar. 14, 2014, 14 pages.
Final Office Action for U.S. Appl. No. 13/189,838, dated Jun. 19, 2014, 10 pages.
Advisory Action for U.S. Appl. No. 13/189,838, dated Aug. 28, 2014, 2 pages.
Non-Final Office Action for U.S. Appl. No. 13/189,838, dated Oct. 28, 2014, 11 pages.
Final Office Action for U.S. Appl. No. 13/189,838, dated Feb. 20, 2015, 13 pages.
Non-Final Office Action for U.S. Appl. No. 13/034,755, dated Aug. 15, 2013, 6 pages.
Final Office Action for U.S. Appl. No. 13/034,755, dated Jan. 31, 2014, 10 pages.
Advisory Action for U.S. Appl. No. 13/034,755, dated Mar. 4, 2014, 3 pages.
Notice of Allowance for U.S. Appl. No. 13/034,755, dated Oct. 17, 2014, 7 pages.
Non-Final Office Action for U.S. Appl. No. 13/034,787, dated Jan. 16, 2013, 9 pages.
Final Office Action for U.S. Appl. No. 13/034,787, dated Mar. 19, 2013, 9 pages.
Advisory Action for U.S. Appl. No. 13/034,787, dated May 17, 2013, 3 pages.
Non-Final Office Action for U.S. Appl. No. 13/034,787, dated Aug. 9, 2013, 9 pages.
Final Office Action for U.S. Appl. No. 13/034,787, dated Nov. 15, 2013, 12 pages.
Advisory Action for U.S. Appl. No. 13/034,787, dated Jan. 27, 2014, 4 pages.
Advisory Action for U.S. Appl. No. 13/034,787, dated Feb. 26, 2014, 4 pages.
Notice of Allowance for U.S. Appl. No. 13/034,787, dated May 1, 2014, 9 pages.
Corrected Notice of Allowability for U.S. Appl. No. 13/034,787, dated Jul. 29, 2014, 5 pages.
Non-Final Office Action for U.S. Appl. No. 12/797,381, dated Jan. 8, 2013, 20 pages.
Final Office Action for U.S. Appl. No. 12/797,381, dated May 16, 2013, 19 pages.
Advisory Action for U.S. Appl. No. 12/797,381, dated Jul. 17, 2013, 3 pages.
Examiner's Answer for U.S. Appl. No. 12/797,381, dated Dec. 31, 2013, 6 pages.
Final Office Action for U.S. Appl. No. 13/036,272, dated Oct. 20, 2014, 6 pages.
Advisory Action for U.S. Appl. No. 13/036,272, dated Jan. 8, 2015, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, dated May 4, 2015, 8 pages.
Notice of Allowance for U.S. Appl. No. 13/189,838, dated Jul. 30, 2015, 5 pages.
Non-Final Office Action for U.S. Appl. No. 13/036,272, dated Apr. 14, 2015, 7 pages.
Non-Final Office Action for U.S. Appl. No. 14/447,847, dated May 7, 2015, 7 pages.
Final Office Action for U.S. Appl. No. 14/447,847, dated Sep. 14, 2015, 8 pages.
Non-Final Office Action for U.S. Appl. No. 13/906,892, dated Aug. 10, 2015, 10 pages.
International Preliminary Report on Patentability and Written Opinion for International Patent Application No. PCT/US2008/068153, dated Jan. 5, 2010, 6 pages.
Non-Final Office Action for U.S. Appl. No. 14/595,401, dated Mar. 28, 2016, 14 pages.
Examination Report for Indian Patent Application No. 8469/DELNP/2009, dated Apr. 11, 2017, 7 pages.
Final Office Action for U.S. Appl. No. 14/595,401, dated Oct. 6, 2016, 15 pages.
Notice of Allowance for U.S. Appl. No. 14/595,401, dated Jan. 6, 2017, 8 pages.
Non-Final Office Action for U.S. Appl. No. 14/750,384, dated Aug. 10, 2017, 9 pages.
Notice of Allowance for U.S. Appl. No. 14/750,384, dated Nov. 22, 2017, 8 pages.
Decision on Appeal for U.S. Appl. No. 12/797,381, mailed Mar. 11, 2016, 6 pages.
Final Office Action for U.S. Appl. No. 13/036,272, dated Nov. 19, 2015, 9 pages.
Advisory Action for U.S. Appl. No. 13/036,272, dated Feb. 5, 2016, 3 pages.
Non-Final Office Action for U.S. Appl. No. 13/036,272, dated Apr. 8, 2016, 7 pages.
Notice of Allowance for U.S. Appl. No. 13/036,272, dated Sep. 30, 2016, 5 pages.
Final Office Action for U.S. Appl. No. 14/447,847, dated Dec. 11, 2015, 8 pages.
Notice of Allowance for U.S. Appl. No. 11/199,319, dated Oct. 2, 2008, 6 pages.
Non-Final Office Action for U.S. Appl. No. 11/435,913, dated May 21, 2010, 5 pages.
Final Office Action for U.S. Appl. No. 11/435,913, dated Nov. 17, 2009, 8 pages.
Non-Final Office Action for U.S. Appl. No. 11/435,913, dated Mar. 2, 2009, 8 pages.
Final Office Action for U.S. Appl. No. 11/435,913, dated Aug. 15, 2008, 8 pages.
Non-Final Office Action for U.S. Appl. No. 11/435,913, dated Jan. 7, 2008, 7 pages.
Non-Final Office Action for U.S. Appl. No. 11/768,014, dated Jan. 21, 2009, 9 pages.
Non-Final Office for U.S. Appl. No. 11/768,014, dated Mar. 25, 2010, 9 pages.
Non-Final Office for U.S. Appl. No. 11/768,014, dated Jul. 10, 2009, 7 pages.
Notice of Allowance for U.S. Appl. No. 13/187,814, dated Sep. 10, 2012, 8 pages.
Non-Final Office Action for U.S. Appl. No. 11/952,484, dated Jan. 8, 2010, 17 pages.
Final Office Action for U.S. Appl. No. 11/952,484, dated Oct. 5, 2010, 19 pages.
Non-Final Office Action for U.S. Appl. No. 11/952,484, dated Oct. 27, 2011, 22 pages.
Non-Final Office Action for U.S. Appl. No. 13/415,643, dated Jan. 3, 2013, 17 pages.
Quayle Action for U.S. Appl. No. 13/415,643, mailed Jul. 11, 2013, 6 pages.
Notice of Allowance for U.S. Appl. No. 13/415,643, dated Aug. 15, 2013, 8 pages.
Non-Final Office Action for U.S. Appl. No. 11/952,513, dated May 10, 2011, 19 pages.
Final Office Action for U.S. Appl. No. 11/952,513, dated Oct. 26, 2011, 16 pages.
Notice of Allowance for U.S. Appl. No. 11/952,513, dated Mar. 6, 2012, 9 pages.
Non-Final Office Action for U.S. Appl. No. 13/117,284, dated Nov. 9, 2011, 12 pages.
Final Office Action for U.S. Appl. No. 13/117,284, dated Feb. 29, 2012, 8 pages.
Notice of Allowance for U.S. Appl. No. 13/117,284, dated May 1, 2012, 8 pages.

(56) References Cited

OTHER PUBLICATIONS

Non-Final Office Action for U.S. Appl. No. 11/952,545, dated Oct. 23, 2009, 12 pages.
Non-Final Office Action for U.S. Appl. No. 12/766,347, dated Jun. 29, 2012, 11 pages.
Notice of Allowance for U.S. Appl. No. 11/952,592, dated Aug. 6, 2012, 7 pages.
Non-Final Office Action for U.S. Appl. No. 11/952,592, dated Sep. 19, 2011, 9 pages.
Final Office Action for U.S. Appl. No. 11/952,592, dated Feb. 24, 2011, 9 pages.
Non-Final Office Action for U.S. Appl. No. 11/952,592, dated Dec. 15, 2010, 9 pages.
Non-Final Office Action for U.S. Appl. No. 11/952,592, dated Jul. 28, 2009, 7 pages.
Final Office Action for U.S. Appl. No. 11/952,592, dated Apr. 16, 2010, 8 pages.
Final Office Action for U.S. Appl. No. 11/952,592, dated Jan. 18, 2012, 10 pages.
Non-Final Office Action for U.S. Appl. No. 11/952,592, dated Jun. 12, 2012, 10 pages.
Notice of Allowance for U.S. Appl. No. 11/952,617, dated Jan. 8, 2013, 8 pages.
Notice of Allowance for U.S. Appl. No. 11/952,617, dated Jun. 4, 2012, 9 pages.
Final Office Action for U.S. Appl. No. 11/952,617, dated Feb. 16, 2012, 7 pages.
Non-Final Office Action for U.S. Appl. No. 11/952,617, dated Jul. 28, 2011, 9 pages.
Non-Final Office Action for U.S. Appl. No. 11/952,617, dated Sep. 26, 2008, 10 pages.
Final Office Action for U.S. Appl. No. 11/952,617, dated Nov. 20, 2009, 16 pages.
Non-Final Office Action for U.S. Appl. No. 11/952,634, dated Jun. 13, 2011, 7 pages.
Final Office Action for U.S. Appl. No. 11/952,634, dated Feb. 1, 2011, 7 pages.
Final Office Action for U.S. Appl. No. 11/952,634, dated Dec. 23, 2010, 8 pages.
Non-Final Office Action for U.S. Appl. No. 11/952,634, dated Jul. 21, 2010, 7 pages.
Notice of Allowance for U.S. Appl. No. 13/151,499, dated Dec. 19, 2013, 8 pages.
International Search Report for PCT/US2008/068153, dated Dec. 9, 2008, 3 pages.
Office Action for Chinese Patent Application No. 200880104171.1, dated Jun. 2, 2011, 20 pages.
Second Office Action for Chinese Patent Application No. 200880104171.1, dated Feb. 16, 2012, 8 pages.
Non-Final Office Action for U.S. Appl. No. 11/952,670, dated Jun. 22, 2011, 4 pages.
Non-Final Office Action for U.S. Appl. No. 11/952,670, dated May 27, 2010, 6 pages.
Notice of Allowance for U.S. Appl. No. 11/952,670, dated Oct. 21, 2009, 6 pages.
Notice of Allowance for U.S. Appl. No. 11/952,670, dated Aug. 24, 2012, 7 pages.
Non-Final Office Action for U.S. Appl. No. 16/372,910, dated Mar. 30, 2020, 13 pages.
International Search Report and Written Opinion for International Patent Application No. PCT/US2019/066721, dated Apr. 24, 2020, 16 pages.
Notice of Allowance for U.S. Appl. No. 14/447,847, dated Feb. 29, 2016, 7 pages.
Notice of Allowance for U.S. Appl. No. 14/447,847, dated Mar. 31, 2016, 7 pages.
Corrected Notice of Allowability for U.S. Appl. No. 14/447,847, dated Jul. 15, 2016, 4 pages.
Final Office Action for U.S. Appl. No. 13/906,892, dated Feb. 11, 2016, 10 pages.
Advisory Action for U.S. Appl. No. 13/906,892, dated Jun. 15, 2016, 2 pages.
Final Office Action for U.S. Appl. No. 13/906,892, dated Aug. 26, 2016, 11 pages.
Advisory Action for U.S. Appl. No. 13/906,892, dated Nov. 28, 2016, 3 pages.
Final Office Action for U.S. Appl. No. 13/906,892, dated Dec. 15, 2016, 11 pages.
Advisory Action for U.S. Appl. No. 13/906,892, dated Mar. 14, 2017, 3 pages.
Non-Final Office Action for U.S. Appl. No. 13/906,892, dated Apr. 3, 2017, 9 pages.
Notice of Allowance for U.S. Appl. No. 13/906,892, dated May 19, 2017, 9 pages.
Non-Final Office Action for U.S. Appl. No. 16/390,761, dated Dec. 27, 2019, 9 pages.
Final Office Action for U.S. Appl. No. 16/372,910, dated Aug. 13, 2020, 13 pages.
Advisory Action for U.S. Appl. No. 16/372,910, dated Oct. 27, 2020, 3 pages.
Non-Final Office Action for U.S. Appl. No. 16/390,761, dated Aug. 20, 2020, 9 pages.
Non-Final Office Action for U.S. Appl. No. 16/893,941, dated Sep. 23, 2020, 8 pages.
Non-Final Office Action for U.S. Appl. No. 16/417,815, dated Sep. 16, 2020, 14 pages.
Non-Final Office Action for U.S. Appl. No. 16/372,910, dated Dec. 31, 2020, 13 pages.
Final Office Action for U.S. Appl. No. 16/390,761, dated Dec. 28, 2020, 8 pages.
Advisory Action for U.S. Appl. No. 16/390,761, dated Feb. 25, 2021, 3 pages.
Notice of Allowance for U.S. Appl. No. 16/893,941, dated Feb. 26, 2021, 7 pages.
Notice of Allowance for U.S. Appl. No. 16/372,910, dated May 18, 2021, 8 pages.
Non-Final Office Action for U.S. Appl. No. 16/390,761, dated Apr. 15, 2021, 6 pages.
Non-Final Office Action for U.S. Appl. No. 16/417,815, dated Mar. 22, 2021, 15 pages.
International Preliminary Report on Patentability for International Patent Application No. PCT/US2019/066721, dated Jul. 1, 2021, 10 pages.

* cited by examiner

ELECTRONIC PACKAGE ARRANGEMENTS AND RELATED METHODS

RELATED APPLICATIONS

This application claims the benefit of provisional patent application Ser. No. 62/782,373, filed Dec. 20, 2018, the disclosure of which is hereby incorporated herein by reference in its entirety.

FIELD OF THE DISCLOSURE

The present disclosure relates to electronic package arrangements and related methods, and particularly to electronic package arrangements with one or more of improved thermal management and electromagnetic shielding.

BACKGROUND

Electronic packages, components, and modules have become ubiquitous in modern society. The electronics industry routinely announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed transitions inherently mean higher frequencies. Higher frequencies mean shorter wavelengths, requiring shorter conductive elements to act as antennas to broadcast these electromagnetic emissions. The electromagnetic emissions radiate from a source and may impinge upon other electronic devices. If the signal strength of the emission at the impinged upon electronic device is high enough, the emission may interfere with the operation of the impinged upon electronic device. This phenomenon is sometimes called electromagnetic interference (EMI) or crosstalk. Dealing with EMI and crosstalk is sometimes referred to as electromagnetic compatibility (EMC). Other devices, such as transceiver modules, inherently have many radiating elements that raise EMI concerns. Thus, even electronic packages and modules that do not have high clock speeds may need to address EMI issues.

One way to reduce EMI to comply with FCC regulations is to electromagnetically shield the electronic modules. Typically a shield is formed from a grounded conductive material that surrounds an electronic module. When electromagnetic emissions from the electronic module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the electronic module experiences reduced EMI from other electronic modules.

Another problem associated with smaller and faster electronic devices involves thermal management. Tightly-packed high frequency devices within electronic packages tend to generate increased levels of heat in compact spaces. Thermal crowding within such electronic packages can lead to increased operating temperatures and decreased performance of electronic devices housed therein.

As electronic packages continue to become smaller from miniaturization, creating effective electromagnetic shields and providing effective thermal management that does not materially add size becomes more difficult. Thus, the art continues to seek improved electronic packages capable of overcoming such challenges.

SUMMARY

The present disclosure relates to electronic package arrangements and related methods, and particularly to electronic package arrangements that provide one or more of improved thermal management and electromagnetic shielding. Electronic packages are disclosed that include arrangements of one or more electronic devices, overmold bodies, and heat spreaders or metal frame structures. The heat spreaders or metal frame structures may be arranged over the electronic devices to form heat dissipation paths that draw operating heat away from the electronic devices in one or more directions including above and below the electronic packages. The heat spreaders or metal frame structures may also be arranged to form electromagnetic shields that reduce crosstalk between the electronic devices within the electronic packages and to suppress unwanted emissions from either escaping or entering the electronic packages.

In one aspect, an electronic package comprises: a substrate forming a first face and a second face that opposes the first face; a first electronic device mounted on the first face of the substrate; an overmold body on the first face and arranged around peripheral edges of the first electronic device, the overmold body forming a first recess that extends through the overmold body to the first face; and a heat spreader arranged over the first electronic device such that the first electronic device is between the heat spreader and the substrate, and the heat spreader is further arranged within the first recess such that the heat spreader is thermally coupled to the first electronic device and the first face of the substrate. In certain embodiments, a top surface of the overmold body is coplanar with a top surface of the first electronic device. In certain embodiments, an interface between the heat spreader and the first electronic device is devoid of the overmold body. In certain embodiments, a thermal interface material is arranged between the heat spreader and the substrate. In certain embodiments, a gap is formed between the heat spreader and the overmold body within the recess. The gap may comprise a thermal interface material. In certain embodiments, the electronic package further comprises a second electronic device mounted on the first face of the substrate, wherein the first recess is arranged between the first electronic device and the second electronic device. In certain embodiments, the heat spreader is electrically grounded to form an electromagnetic shield between the first electronic device and the second electronic device within the first recess. In certain embodiments, the electronic package further comprises a second recess that extends along a periphery of the first electronic device and the second electronic device such that heat spreader further forms the electromagnetic shield around the periphery of the first electronic device and the second electronic device. In certain embodiments, the first recess is continuous with the second recess. In certain embodiments, the first recess is formed to surround the first electronic device on the first face of the substrate. In certain embodiments, the heat spreader forms an electromagnetic shield that encloses the first electronic device on the first face of the substrate.

In another aspect, a method comprises: providing a substrate comprising a first face and a second face that opposes the first face; mounting a first electronic device on the first face of the substrate; forming an overmold body around peripheral edges of the first electronic device, the overmold body forming a recess that extends through the overmold body to the first face of the substrate; placing a heat spreader over the first electronic device and within the recess such that the heat spreader is thermally coupled to the first electronic device and the first face of the substrate. In certain embodiments, forming the overmold body comprises a film-assisted molding process. In certain embodiments, the method further comprises planarizing the overmold body to expose a top surface of the first electronic device before placing the heat spreader over the first electronic device. In certain embodiments, a gap is formed between the heat spreader and the overmold body within the recess.

In another aspect, an electronic package comprises: a substrate forming a first face and a second face that opposes the first face; a first electronic device mounted on the first face of the substrate; an overmold body on the first face, the overmold body forming a first recess that extends through the overmold body to the first face of the substrate; and a metal frame structure arranged over the overmold body and within the first recess such that the metal frame structure forms an electromagnetic shield for the first electronic device. In certain embodiments, a gap is formed between the metal frame structure and the overmold body within the first recess. In certain embodiments, the gap comprises a thermal interface material. In certain embodiments, a portion of the overmold body is arranged between the metal frame structure and the first electronic device. In certain embodiments, the electronic package further comprises a second electronic device mounted on the first face of the substrate, wherein the first recess is arranged between the first electronic device and the second electronic device such that the metal frame structure forms the electromagnetic shield between the first electronic device and the second electronic device. In certain embodiments, the electronic package further comprises a second recess that extends along a periphery of the first electronic device and the second electronic device such that metal frame structure further forms the electromagnetic shield around the periphery of the first electronic device and the second electronic device. In certain embodiments, the first recess is continuous with the second recess.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
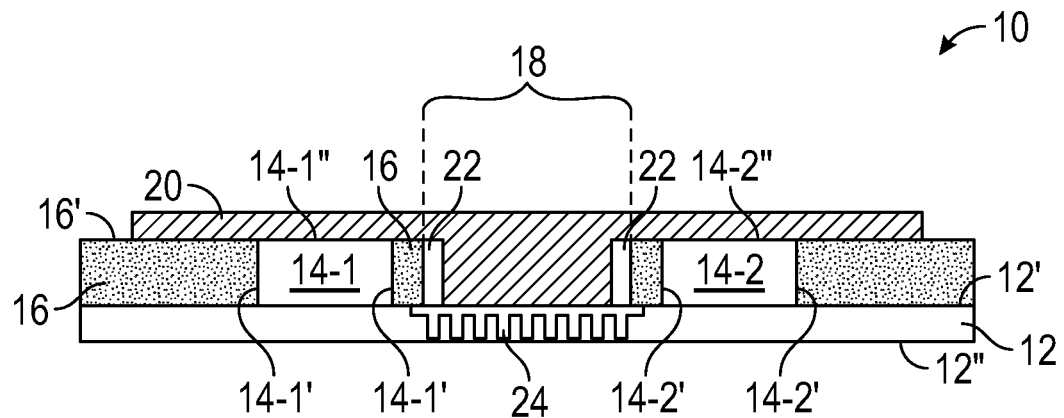
FIG. 1A is a cross-sectional view of an electronic package arrangement for a heat spreader, one or more electronic devices, and an overmold body according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to electronic package arrangements and related methods, and particularly to electronic package arrangements that provide one or more of improved thermal management and electromagnetic shielding. Electronic packages are disclosed that include arrangements of one or more electronic devices, overmold bodies, and heat spreaders or metal frame structures. The heat spreaders or metal frame structures may be arranged over the electronic devices to form heat dissipation paths that draw operating heat away from the electronic devices in one or more directions including above and below the electronic packages. The heat spreaders or metal frame structures may also be arranged to form electromagnetic shields that reduce crosstalk between the electronic devices within the electronic packages and to suppress unwanted emissions from either escaping or entering the electronic packages.

FIG. 1A is a cross-sectional view of an electronic package 10 according to embodiments disclosed herein. The electronic package 10 includes a substrate 12 that forms a first face 12' and a second face 12" that generally opposes the first face 12'. As illustrated, the first face 12' and the second face 12" form opposing major faces of the substrate 12. The substrate 12 may provide one or more of mechanical support and electrical connections for the electronic package 10. In certain embodiments, the substrate 12 comprises a laminate material of one or more alternating layers or sheets of conductive and non-conductive materials with matched or similar coefficients of thermal expansion. The laminate material may comprise organic materials or inorganic materials. In certain embodiments, the substrate 12 may comprise a printed circuit board (PCB), while in other embodiments, the substrate 12 may comprise a low temperature co-fired ceramic (LTCC) substrate.

In FIG. 1A, one or more electronic devices 14-1, 14-2 are mounted on the first face 12' of the substrate 12. While first and second electronic devices 14-1, 14-2 are drawn for illustrative purposes, the electronic package 10 may include any number of electronic devices of various types depending on the application. The electronic devices 14-1, 14-2 may include one or more of electrical die, chips, components, and sub-modules. For example, one or more of the electronic devices 14-1, 14-2 may include an electronic circuit built on its own semiconductor substrate, such as a processor, volatile memory, non-volatile memory, a radio frequency (RF) circuit, a micro-electro-mechanical system (MEMS) device, an integrated passive device (IPD), or various other integrated circuits (ICs). In certain embodiments, one or more of the electronic devices 14-1, 14-2 may include filters, capacitors, inductors, resistors, power resistors, amplifiers, low-noise amplifiers (LNA) such as gallium arsenide (GaAs)-based LNAs, power amplifiers (PAs), switching devices, silicon-on-insulator (SOI) switching devices, attenuators, transmit/receive modules, or electronic circuits having combinations thereof. The one or more electronic devices 14-1, 14-2 may include one or more Group III-V semiconductor materials such as GaAs- and gallium nitride (GaN)-based devices. In certain embodiments, the electronic devices 14-1, 14-2 may comprise electrically active devices, electrically passive devices, or combinations thereof. One or more of the electronic devices 14-1, 14-2 may be flip-chip mounted to the substrate 12 such that electrical connections are made without the use of wirebonds. In operation, the electronic devices 14-1, 14-2 may generate heat and may accordingly be referred to as heat-generating devices.

A body, such as an overmold body 16 or overmold material, is arranged over the substrate 12 and surrounding each of the electronic devices 14-1, 14-2 on the first face 12'. The overmold body 16 may comprise one or more insulating or dielectric materials such as plastics, thermoplastics, and epoxy mold compounds. In this regard, the overmold body 16 may be configured to provide encapsulation and electrical isolation for the electronic devices 14-1, 14-2 that are mounted on the substrate 12. In certain embodiments, the overmold body 16 forms a recess 18 or cavity that extends through the overmold body 16 to the first face 12' of the substrate 12. The recess 18 may be formed through an entire thickness of the overmold body 16 to the first face 12'. Notably, the recess 18 is spaced from the electronic devices 14-1, 14-2 such that overmold body 16 is arranged around peripheral edges 14-1', 14-2' of each of the electronic devices 14-1, 14-2. In this manner, portions of the overmold body 16 are positioned between each of the electronic devices 14-1, 14-2 and the recess 18. As illustrated, the recess 18 may be arranged between the first electronic device 14-1 and the second electronic device 14-2.

The electronic package 10 further includes a heat spreader 20 that is arranged over the electronic devices 14-1, 14-2 and the overmold body 16 such that the electronic devices 14-1, 14-2 are between the heat spreader 20 and the substrate 12. In certain embodiments, top surfaces 14-1", 14-2" of one or more of the electronic devices 14-1, 14-2 may be coplanar with a top surface 16' of the overmold body 16. This provides an arrangement where an interface is formed between the heat spreader 20 and the top surfaces 14-1", 14-2" of the electronic devices 14-1, 14-2 that is devoid of the overmold body 16. As such, the heat spreader 20 may be arranged on the overmold body 16 and on one or more of the electronic devices 14-1, 14-2 without having portions of the overmold body 16 provided between the heat spreader 20 and the electronic devices 14-1, 14-2. In this regard, the heat spreader 20 may be configured to have improved thermal coupling with the electronic devices 14-1, 14-2. In certain embodiments, the interface between the heat spreader 20 and the top surfaces 14-1", 14-2" of the electronic devices 14-1, 14-2 that is devoid of the overmold body 16 need not extend across the entirety of the top surfaces 14-1", 14-2" to provide improved thermal coupling.

Additionally, the heat spreader 20 may be arranged within the recess 18 to be thermally coupled with the first face 12' of the substrate 12. In this regard, a heat dissipation path, or a low thermal impedance path, is formed that may effectively draw heat away from the top surfaces 14-1", 14-2" of the electronic devices 14-1, 14-2, laterally across portions of the overmold body 16, and through the recess 18 to the substrate 12. As such, the heat dissipation path provided by the heat spreader 20 allows the electronic devices 14-1, 14-2 to have reduced junction temperatures during operation, thereby providing improved electrical performance, reliability and life-time. In certain embodiments, the heat spreader 20 comprises a thermally conductive material, such as a metal or a thermally conductive ceramic. In particular, the heat spreader 20 may comprise one or more of copper (Cu), Cu alloys, aluminum (Al), Al alloys, and aluminum nitride (AlN), among other materials. The heat spreader 20 may be formed separately from the electronic package 10 and the heat spreader 20 may subsequently be attached to the electronic package 10. For example, the heat spreader 20 may initially be formed as part of a lead frame structure that is subsequently divided into a plurality of individual heat spreaders. The heat spreader 20 may form a single continuous piece of material that is arranged over the electronic devices 14-1, 14-2 and within the recess 18 to the substrate 12. As such, the heat spreader 20 may be referred to as an insert for the electronic package 10.

In certain embodiments, the recess 18 may be formed with a larger lateral dimension across the first face 12' of the substrate 12 than the portion of the heat spreader 20 that extends within the recess 18. By forming the recess 18 in this manner, alignment tolerances for placement of the heat spreader 20 may be improved, thereby reducing the need for complex aligner and placement equipment. In this regard, one or more gaps 22 may be formed between the heat spreader 20 and portions of the overmold body 16 within in the recess 18. The one or more gaps 22 may comprise air gaps. In other embodiments, the one or more gaps 22 may comprise or be filled with a thermal interface material, such as a thermal epoxy, grease, adhesive, or the like, that may facilitate attachment of the heat spreader 20 while also providing additional thermal coupling within the recess 18. Since the heat spreader 20 is a structure that is attached to the electronic package 10 in certain embodiments, the thermal interface material may be provided between the heat spreader 20 and the substrate 12 in various locations, such as between the heat spreader 20 and the top surfaces 14-1", 14-2" of the electronic devices 14-1, 14-2, between the heat spreader 20 and portions of the substrate 12 within the recess 18, and within the gaps 22 as described above.

For applications where reduced electromagnetic interference (EMI) is desirable, the heat spreader 20 may form an electromagnetic shield between the electronic devices 14-1, 14-2 within the recess 18 of the electronic package 10. In particular, the heat spreader 20 may comprise an electrically conductive metal that is electrically grounded within the recess 18 by way of a metallic structure 24 of the substrate 12. The metallic structure 24 may form one or more electrically grounded vias within the substrate 12 or, in alternative arrangements, an electrically grounded single metal block or embedded slug within the substrate 12. In this manner, electromagnetic emissions between the electronic devices 14-1, 14-2 that strike the heat spreader 20 are electrically shorted to ground, thereby reducing EMI or crosstalk. By forming the heat spreader 20 as an electromagnetic shield, sub-regions, or sub-channels, of the electronic package 10 are formed or divided on the substrate 12 by the heat spreader 20, each of which may be filled or occupied by sub-groups of the electronic devices 14-1, 14-2, portions of the overmold body 16, and the gaps 22. The heat spreader 20 may sub-divide the electronic package 10 to electrically isolate one or more of the electronic devices 14-1, 14-2 from each other. Accordingly, the heat spreader 20 may be configured to provide one or more of improved thermal spreading and improved EMI shielding for the electronic package 10. By providing a single element (e.g., the heat spreader 20) that provides both improved thermal dissipation and electromagnetic shielding, dimensions of the electronic package 10 may be scaled smaller for high frequency applications without sacrificing device performance, reliability, and life-time.

Figure 1B:
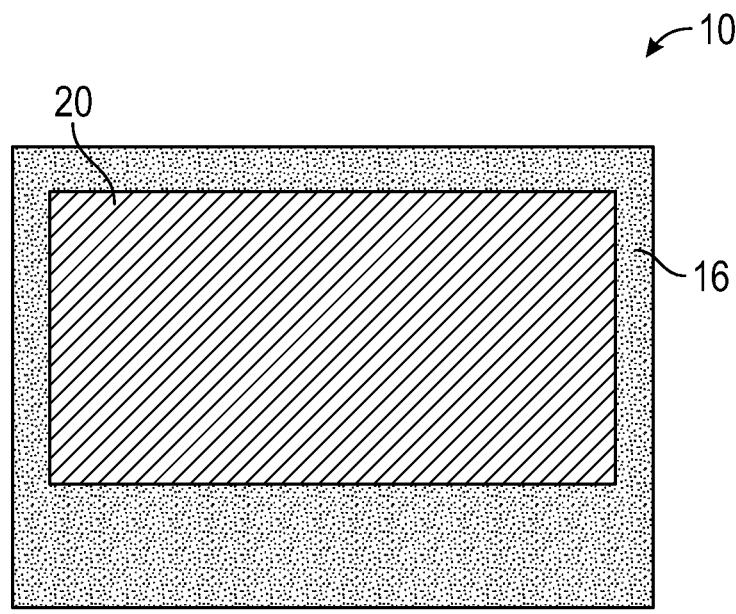
FIG. 1B is a top view of the electronic package of FIG. 1A.

FIG. 1B is a top view of the electronic package 10 of FIG. 1A. In certain embodiments, the heat spreader 20 occupies a smaller surface area of the electronic package 10 than the overmold body 16. In other embodiments, the heat spreader 20 may be arranged to substantially cover the entire overmold body 16. While the heat spreader 20 is illustrated with a rectangular shape, many alternative shapes are contemplated without deviating from the concepts disclosed herein. For example, the shape of the heat spreader 20 from the top view may be tailored to different layouts of electronic devices (14-1, 14-2 of FIG. 1A) that vary for different applications.

Figure 2A:
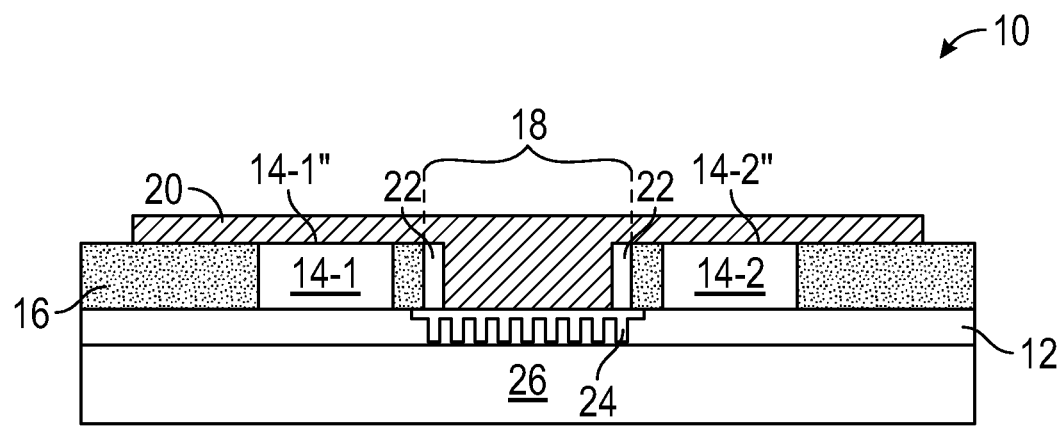
FIG. 2A is a cross-sectional view of the electronic package of FIG. 1A that includes or is mounted to a bottom heat sink.

FIG. 2A is a cross-sectional view of the electronic package 10 of FIG. 1A that includes or is mounted to a bottom heat sink 26. As illustrated, the bottom heat sink 26 is arranged such that the substrate 12 is between the bottom heat sink 26 and the electronic devices 14-1, 14-2. The bottom heat sink 26 may include a highly thermally conductive material, such as one or more metals, ceramics, plastics, and combinations thereof. In certain embodiments, the bottom heat sink 26 comprises Al or alloys thereof. The bottom heat sink 26 may be formed as an integrated piece of the electronic package 10, or the bottom heat sink 26 may form part of a larger housing or fixture the electronic package 10 is mounted to. Thermal interface material may be provided between the electronic package 10 and the bottom heat sink 26. In this arrangement, a heat dissipation path provided by the heat spreader 20 draws heat away from the top surfaces 14-1", 14-2" of the electronic device 14-1, 14-2, across portions of the overmold body 16, into the recess 18, and through the substrate 12 to the bottom heat sink 26. In certain embodiments, the metallic structure 24 of the substrate forms part of the heat dissipation path between the heat spreader 20 and the bottom heat sink 26. Additionally, for electromagnetic shielding applications, the heat spreader 20 may be electrically grounded to the bottom heat sink 26 by way of the metallic structure 24.

Figure 2B:
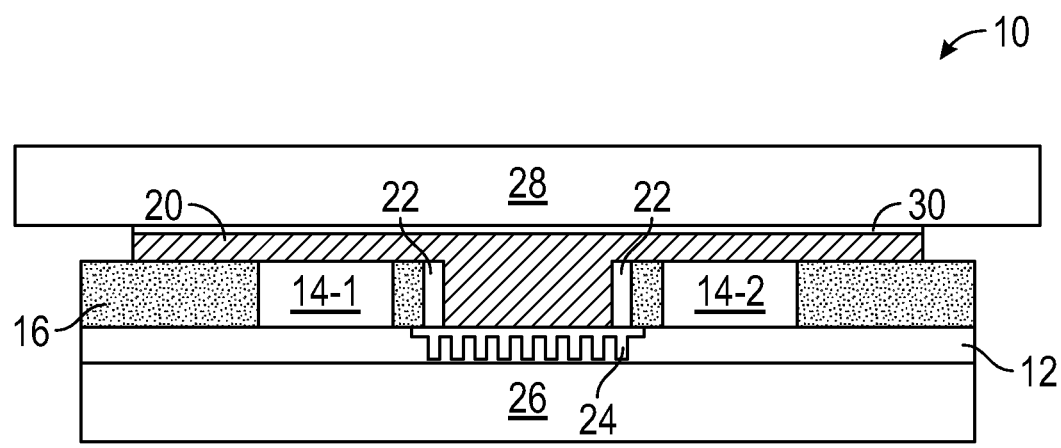
FIG. 2B is a cross-sectional view of the electronic package of FIG. 2A that includes or is mounted to a top heat sink.

FIG. 2B is a cross-sectional view of the electronic package 10 of FIG. 2A that includes or is mounted to a top heat sink 28. Since the heat spreader 20 is accessible for thermal coupling above the electronic devices 14-1, 14-2, the top heat sink 28 may be arranged such that the electronic devices 14-1, 14-2 are between the top heat sink 28 and the substrate 12. In a similar manner to the bottom heat sink 26, the top heat sink 28 may include a highly thermally conductive material, such as one or more metals, ceramics, plastics, and combinations thereof. In certain embodiments, the top heat sink 28 comprises Al or alloys thereof. The top heat sink 28 may be formed as an integrated piece of the electronic package 10 or top heat sink 28 may form part of a larger housing or fixture the electronic package 10 is mounted to. In certain embodiments, a combination of the top heat sink 28 and the bottom heat sink 26 provides heat dissipation paths above and below the electronic devices 14-1, 14-2 for improved thermal management of device operating temperatures. In FIG. 2B, a thermal interface material 30, such as a thermal epoxy, grease or adhesive, is illustrated between the top heat sink 28 and the heat spreader 20; however, thermal interface materials may be present in other locations of the electronic package 10 as previously described. The thermal interface material 30 may provide a compliant thermal interface between the top heat sink 28 and the heat spreader 20. In other embodiments, the thermal interface material 30 may be omitted.

Figure 3A:
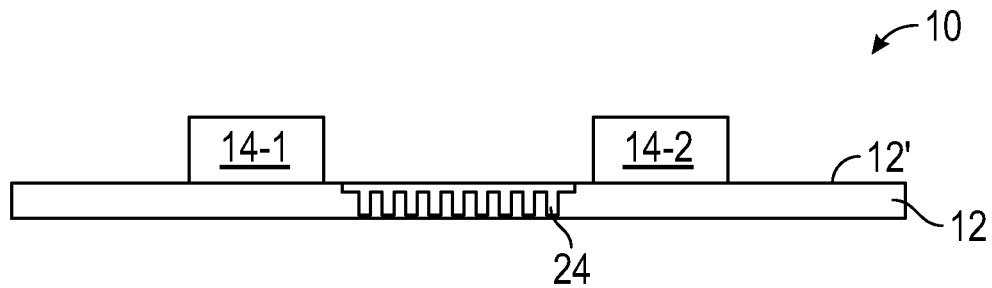
FIGS. 3A-3E are cross-sectional views of the electronic package of FIG. 1A at various state of fabrication according to embodiments disclosed herein.
Figure 3B:
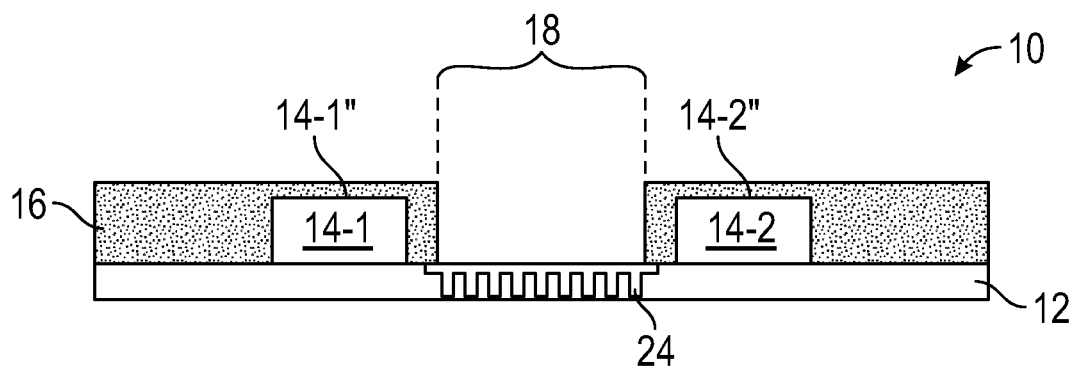

FIGS. 3A-3E are cross-sectional views of the electronic package 10 of FIG. 1A at various state of fabrication according to embodiments disclosed herein. In FIG. 3A, the electronic devices 14-1, 14-2 are mounted to the first face 12' of the substrate 12. The metallic structure 24 is provided in the substrate 12 in an arrangement that is vertically positioned between the electronic devices 14-1, 14-2, although the metallic structure 24 may be provided in other locations depending on the application. In FIG. 3B, the overmold body 16 is formed over the substrate 12 and the electronic devices 14-1, 14-2. In certain embodiments, the overmold body 16 is formed to entirely cover the top surfaces 14-1", 14-2" of the electronic devices 14-1, 14-2. The recess 18 may be formed in the overmold body 16 in a position that is registered with the metallic structure 24. In certain embodiments, the overmold body 16 and the recess 18 may be formed by a molding process where the substrate 12 and the electronic devices 14-1, 14-2 are loaded into a mold housing that includes a shape corresponding to the recess 18. The material of the overmold body 16 may then flow and be subsequently solidified or cured in other spaces of the mold housing, thereby forming the overmold body 16 and the recess 18. In certain embodiments, the molding process for the overmold body 16 comprises a film-assisted molding (FAM) process or a FAM transfer molding process. In other embodiments, the molding process may use a corresponding mold, mold frame, or mold chase tooling design without employing FAM techniques.

Figure 3C:
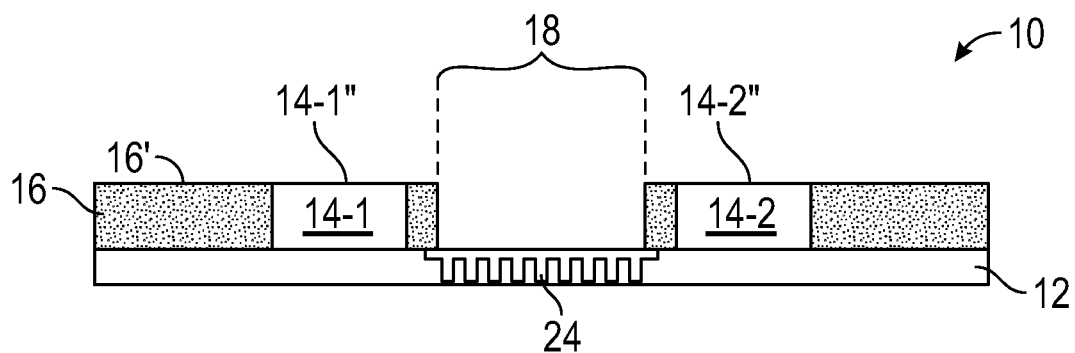

In FIG. 3C, the overmold body 16 is planarized to expose the top surfaces 14-1", 14-2" of the electronic devices 14-1, 14-2. Planarizing the overmold body 16 may comprise a grinding or polishing step. In certain embodiments where the electronic devices 14-1, 14-2 are flip-chip mounted to the substrate 12, planarizing may be referred to as back grinding. In this manner, the top surface 16' of the overmold body 16 is formed to be coplanar with the top surfaces 14-1", 14-2" of the electronic devices 14-1, 14-2. While both top surfaces 14-1", 14-2" are illustrated as coplanar with the top surface 16' of the overmold body 16, the electronic devices 14-1, 14-2 may have differing heights or thicknesses above the substrate 12. In certain embodiments, certain ones of the electronic devices 14-1, 14-2 that generate higher levels of operating heat may have greater heights or thicknesses than other electronic devices 14-1, 14-2. As such, the planarizing step may be halted such that only the certain ones of the electronic devices 14-1, 14-2 having the greatest heights are coplanar with the top surface 16' of the overmold body 16.

Figure 3D:
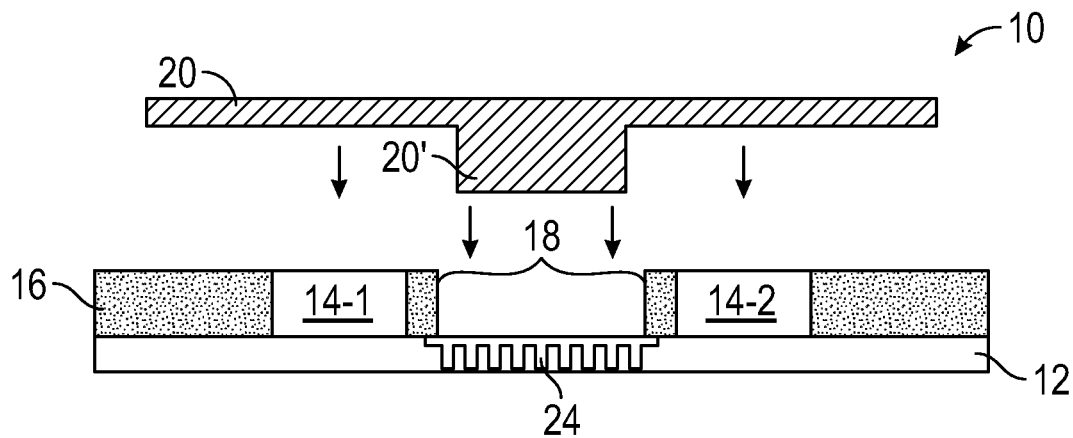
Figure 3E:
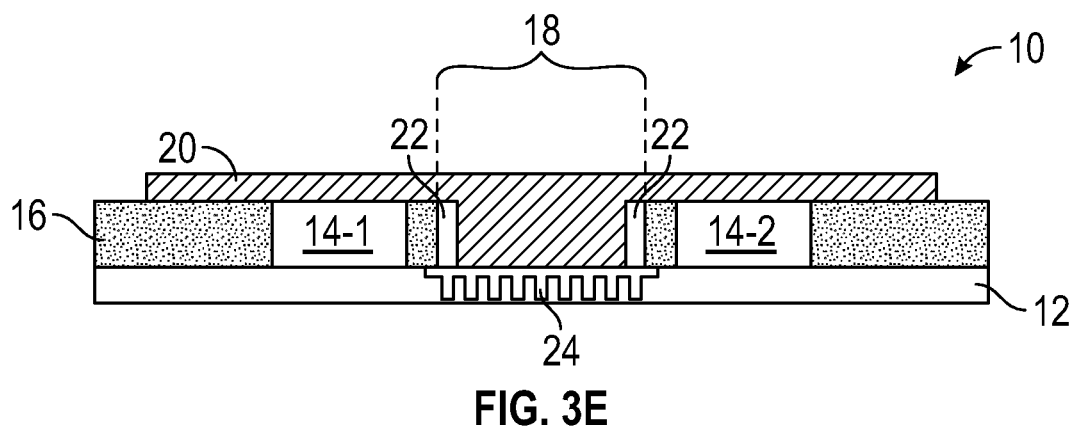

In FIG. 3D, the heat spreader 20 is positioned over the substrate 12 such that a protrusion 20' of the heat spreader 20 is registered with the recess 18. The heat spreader 20 may initially be formed as part of a larger foil or lead frame structure. The protrusion 20' may be formed by a masked etching process, such as laser etching and the like. In FIG. 3E, the heat spreader 20 is attached or otherwise fixed to the electronic package 10, thereby forming the one or more gaps 22 between the heat spreader 20 and the overmold body 16. As previously described, embodiments with the gaps 22 allow larger alignment tolerances for placement of the heat spreader 20 within the recess 18.

Figure 4:
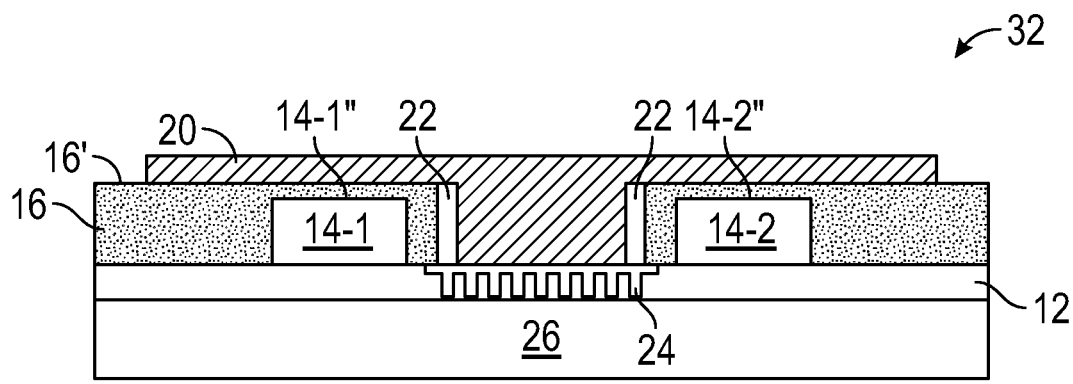
FIG. 4 is a cross-sectional view of an electronic package where an overmold body is formed above electronic devices according to embodiments disclosed herein.

FIG. 4 is a cross-sectional view of an electronic package 32 where the overmold body 16 is formed above the electronic devices 14-1, 14-2 according to embodiments disclosed herein. In certain embodiments, thermal management may be less of a concern for operating temperatures of certain electronic devices 14-1, 14-2. In this regard, the top surface 16' of the overmold body 16 need not be formed coplanar with the top surfaces 14-1", 14-2" of the electronic devices 14-1, 14-2. As illustrated, the top surface 16' of the overmold body 16 is provided above the top surfaces 14-1", 14-2" of the electronic devices 14-1, 14-2 in a manner such that portions of the overmold body 16 are arranged between the heat spreader 20 and the electronic devices 14-1, 14-2. As such, the heat spreader 20 may comprise a metal frame structure that forms an electromagnetic shield between the first electronic device 14-1 and the second electronic device 14-2 while being thermally decoupled from the electronic devices 14-1, 14-2 by portions of the overmold body 16. As before, the one or more gaps 22 formed between the heat spreader 20 and the overmold body 16 may comprise one or more of air and a thermal interface material. In FIG. 4, the bottom heat sink 26 is provided as previously described for FIG. 2A. In certain embodiments, the electronic package 32 may further comprise the top heat sink (28 of FIG. 2B).

Figure 5A:
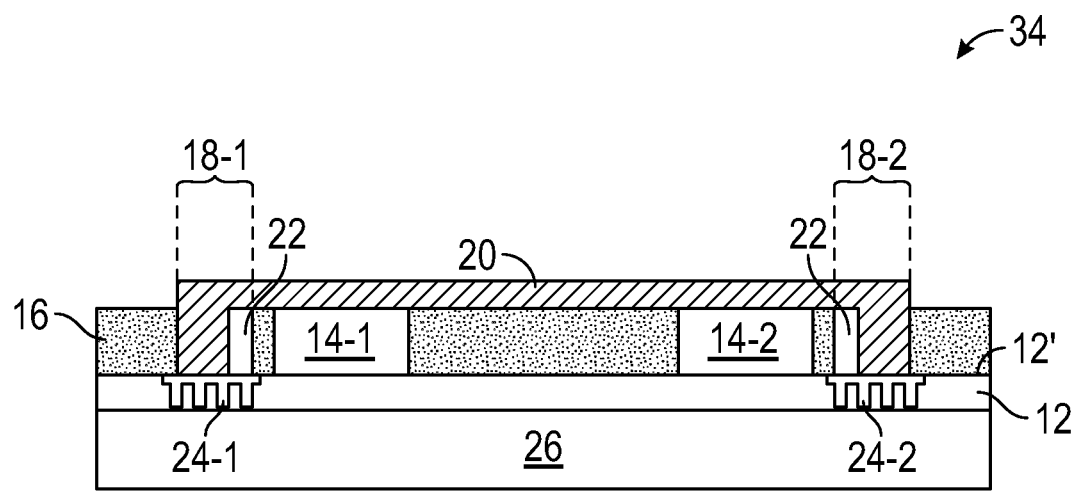
FIG. 5A is a cross-sectional view of an electronic package where an overmold body forms a plurality of recesses according to embodiments disclosed herein.
Figure 5B:
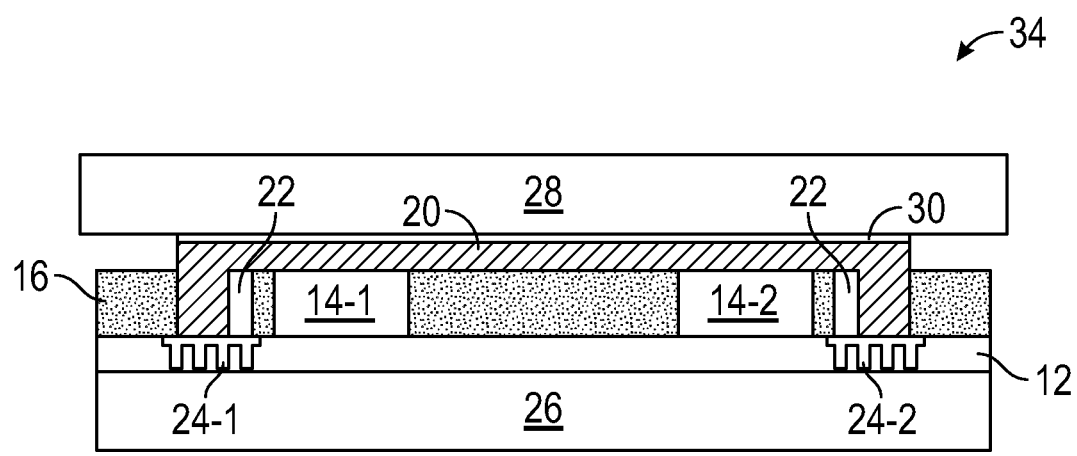
FIG. 5B is a cross-sectional view of the electronic package of FIG. 5A that further includes a top heat sink.

FIG. 5A is a cross-sectional view of an electronic package 34 where the overmold body 16 forms a plurality of recesses 18-1, 18-2 according to embodiments disclosed herein. The plurality of recesses 18-1, 18-2 may be formed in a similar manner to the recess 18 as described for FIG. 3B and FIG. 3C. In FIG. 5A, the recesses 18-1, 18-2 are formed along a periphery of the first face 12' of substrate 12 relative to where the electronic devices 14-1, 14-2 are mounted. In this manner, the heat spreader 20 may be formed over the electronic devices 14-1, 14-2 and within the recesses 18-1, 18-2 to be electrically grounded to portions of the substrate 12 along the periphery of the electronic devices 14-1, 14-2. As illustrated, the heat spreader 20 may be electrically grounded by way of a plurality of metallic structures 24-1, 24-2 that are formed in the substrate 12. By electrically grounding the heat spreader 20 to the substrate 12 around the periphery of the electronic devices 14-1, 14-2, the heat spreader 20 forms an electromagnetic shield that is configured to suppress unwanted emissions from either escaping or entering the electronic package 34. In the cross-sectional view of FIG. 5A, the recesses 18-1, 18-2 appear in separate areas of the overmold body 16; however, in certain embodiments, the recesses 18-1, 18-2 may form a single continuous recess or border that extends along the substrate 12 to either partially or completely surround the electronic devices 14-1, 14-2 on first face 12' the substrate 12. In this manner, the heat spreader 20 may form an electromagnetic shield that either partially or fully encloses the electronic devices 14-1, 14-2. When the heat spreader 20 is positioned within the recesses 18-1, 18-2, the one or more gaps 22 may be formed as previously described. As illustrated in FIG. 5A, the bottom heat sink 26 may be provided as previously described for FIG. 2A. FIG. 5B is a cross-sectional view of the electronic package 34 of FIG. 5A that further includes the top heat sink 28. As illustrated, in certain embodiments, the top heat sink 28 may be attached to the heat spreader 20 with or without the thermal interface material 30 as previously described.

Figure 6A:
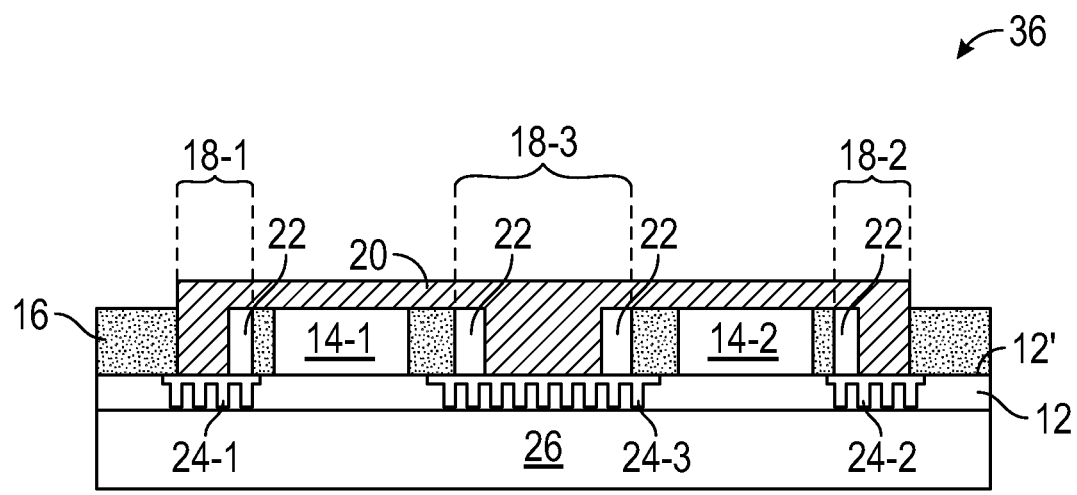
FIG. 6A is a cross-sectional view of an electronic package where a heat spreader forms an electromagnetic shield around a periphery of and between electronic devices according to embodiments disclosed herein.
Figure 6B:
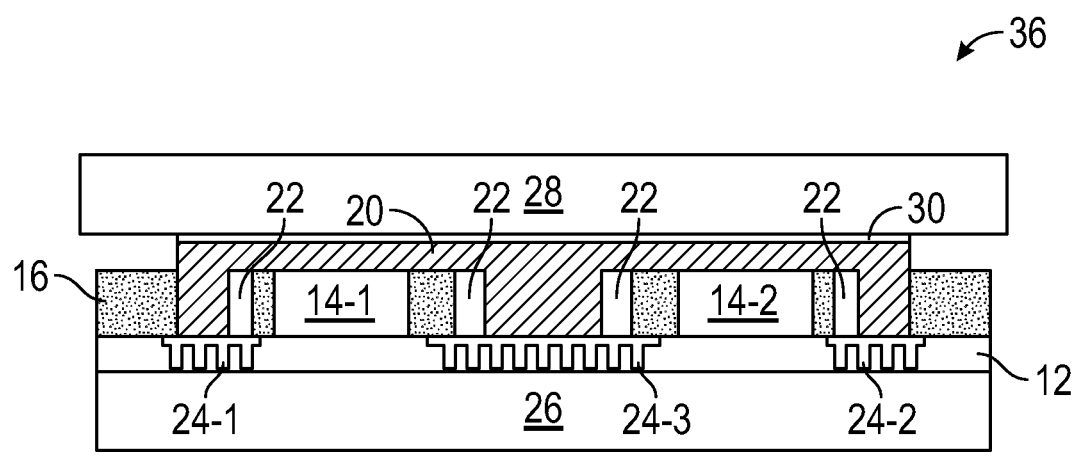
FIG. 6B is a cross-sectional view of the electronic package of FIG. 6A that further includes a top heat sink.

FIG. 6A is a cross-sectional view of an electronic package 36 where the heat spreader 20 forms an electromagnetic shield around a periphery of the electronic devices 14-1, 14-2 and between the electronic devices 14-1, 14-2 according to embodiments disclosed herein. In this manner, the recesses 18-1, 18-2 are formed in the overmold body 16 as described for FIG. 5A, while a recess 18-3 is formed in the overmold body 16 as described for FIG. 1A. Corresponding metallic structures 24-1 to 24-3 of the substrate 12 are registered with corresponding ones of the recesses 18-1 to 18-3. As such, the heat spreader 20 may be electrically grounded between the electronic devices 14-1, 14-2 and along the periphery of the electronic devices 14-1, 14-2. In this arrangement, the heat spreader 20 provides electromagnetic shielding to reduce crosstalk between the electronic devices 14-1, 14-2 and to suppress unwanted emissions from either escaping or entering the electronic package 36. In certain embodiments, the recesses 18-1 to 18-3 may form a continuous recess or border that extends between and around the periphery of the electronic devices 14-1, 14-2 along the first face 12' of the substrate 12. In other embodiments, one or more of the recess 18-1 to 18-3 may be discontinuous. For example, the recess 18-3 may extend between the electronic devices 14-1, 14-2 and be discontinuous with either of the other recesses 18-1, 18-2. When the heat spreader 20 is positioned within the recesses 18-1 to 18-3, the one or more gaps 22 may be formed as previously described. As illustrated in FIG. 6A, the bottom heat sink 26 may be provided as previously described for FIG. 2A. FIG. 6B is a cross-sectional view of the electronic package 36 of FIG. 6A that further includes the top heat sink 28. As illustrated, in certain embodiments, the top heat sink 28 may be attached to the heat spreader 20 with or without the thermal interface material 30 as previously described.

Figure 7:
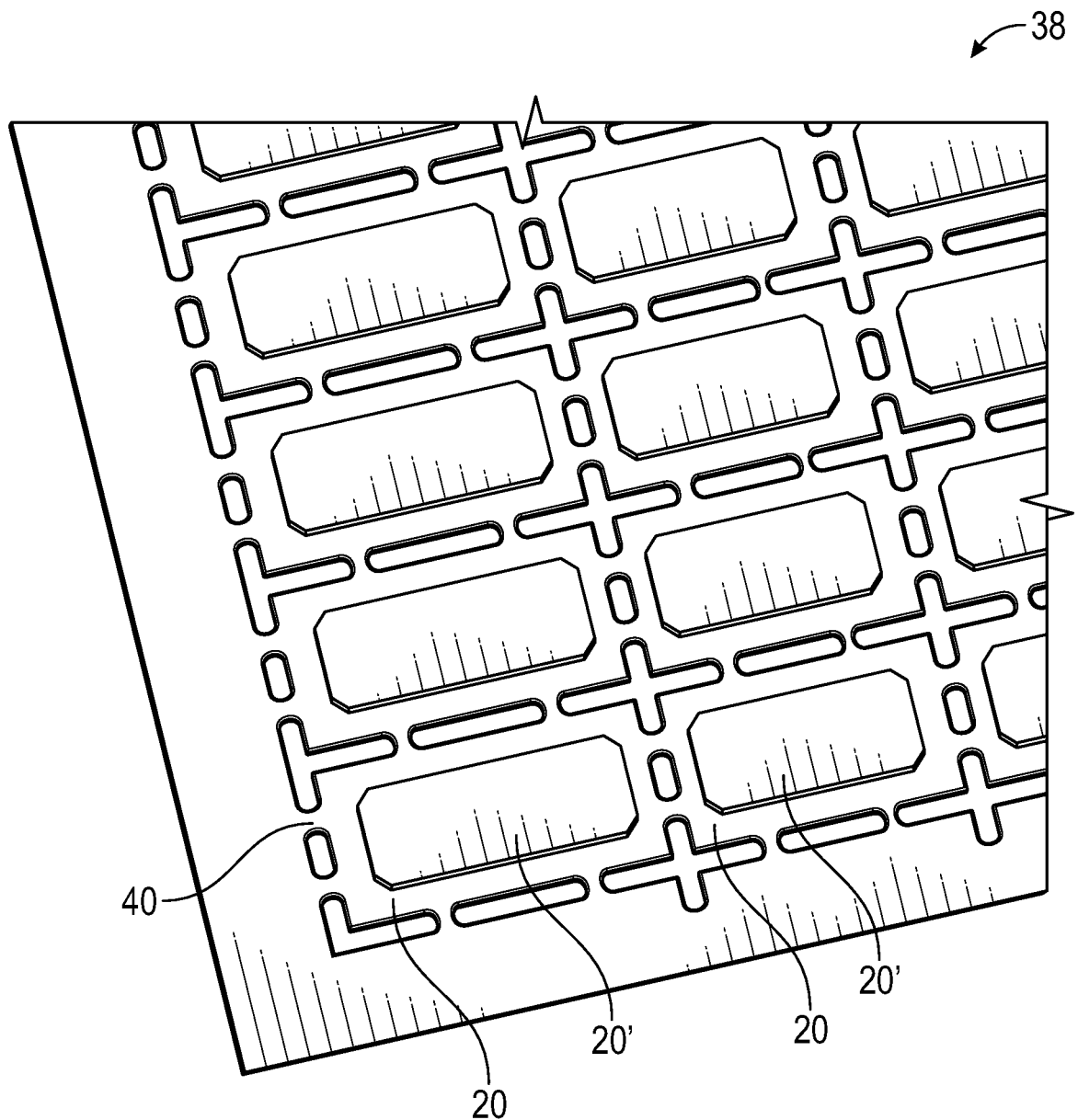
FIG. 7 is a partial perspective view of a lead frame structure according to embodiments disclosed herein.

FIG. 7 is a partial perspective view of a lead frame structure 38 according to embodiments disclosed herein. The lead frame structure 38 may comprise a foil or a frame of metal where a plurality of the heat spreaders 20 have been formed. In certain embodiments, the lead frame structure 38 comprises one or more of Cu, Cu alloys, Al, and Al alloys. Each of the heat spreaders 20 and corresponding protrusions 20' may be formed by an etching process, such as laser etching or masked laser etching as previously described. The plurality of heat spreaders 20 are connected by tabs 40 of the lead frame structure 38 that are subsequently severed to form individual ones of the heat spreaders 20. In certain embodiments, the lead frame structure 38 may be attached to an array of electronic devices (e.g., 10 of FIG. 1A) such that individual ones of the heat spreaders 20 are attached to corresponding electronic devices. Accordingly, the tabs 40 may be severed to form individual electronic devices, each of which includes one of the heat spreaders 20. In other embodiments, individual heat spreaders 20 may be singulated from the lead frame structure 38 prior to being attached to corresponding electronic devices.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An electronic package comprising:
a substrate forming a first face and a second face that opposes the first face;
a first electronic device mounted on the first face of the substrate;
an overmold body on the first face of the substrate and arranged around peripheral edges of the first electronic device, the overmold body forming a first recess that extends through the overmold body to the first face of the substrate;
a heat spreader arranged over the first electronic device such that the first electronic device is between the heat spreader and the substrate, and the heat spreader is further arranged within the first recess such that the heat spreader is thermally coupled to the first electronic device and the first face of the substrate; and
a bottom heat sink on the second face of the substrate, wherein a heat dissipation path is formed between the heat spreader and the bottom heat sink that extends through the first recess and the substrate.

2. The electronic package of claim 1, wherein a top surface of the overmold body is coplanar with a top surface of the first electronic device.

3. The electronic package of claim 1, wherein an interface between the heat spreader and the first electronic device is devoid of the overmold body.

4. The electronic package of claim 1, wherein a thermal interface material is arranged between the heat spreader and the substrate.

5. The electronic package of claim 1, wherein a gap is formed between the heat spreader and the overmold body within the first recess.

6. The electronic package of claim 5, wherein the gap comprises a thermal interface material.

7. The electronic package of claim 1, further comprising a second electronic device mounted on the first face of the substrate, wherein the first recess is arranged between the first electronic device and the second electronic device.

8. The electronic package of claim 7, wherein the heat spreader is electrically grounded to form an electromagnetic shield between the first electronic device and the second electronic device within the first recess.

9. The electronic package of claim 8, further comprising a second recess that extends along a periphery of the first electronic device and the second electronic device such that the heat spreader further forms the electromagnetic shield around the periphery of the first electronic device and the second electronic device.

10. The electronic package of claim 9, wherein the first recess is continuous with the second recess.

11. The electronic package of claim 1, wherein the first recess is formed to surround the first electronic device on the first face of the substrate.

12. The electronic package of claim 11, wherein the heat spreader forms an electromagnetic shield that encloses the first electronic device on the first face of the substrate.

13. A method comprising:
providing a substrate comprising a first face and a second face that opposes the first face;
mounting a first electronic device on the first face of the substrate;

forming an overmold body around peripheral edges of the first electronic device, the overmold body forming a recess that extends through the overmold body to the first face of the substrate;

forming a heat spreader from a lead frame structure; and placing the heat spreader over the first electronic device and within the recess such that the heat spreader is thermally coupled to the first electronic device and the first face of the substrate.

14. The method of claim 13, wherein forming the overmold body comprises a film-assisted molding process.

15. The method of claim 13, further comprising planarizing the overmold body to expose a top surface of the first electronic device before placing the heat spreader over the first electronic device.

16. The method of claim 13, wherein a gap is formed between the heat spreader and the overmold body within the recess.

17. An electronic package comprising:
a substrate forming a first face and a second face that opposes the first face;
a first electronic device mounted on the first face of the substrate;
an overmold body on the first face of the substrate, the overmold body forming a first recess that extends through the overmold body to the first face of the substrate;
a metal frame structure arranged over the overmold body and within the first recess such that the metal frame structure forms an electromagnetic shield for the first electronic device; and
a bottom heat sink on the second face of the substrate, wherein a heat dissipation path is formed between the metal frame structure and the bottom heat sink that extends through the first recess and the substrate.

18. The electronic package of claim 17, wherein a gap is formed between the metal frame structure and the overmold body within the first recess.

19. The electronic package of claim 18, wherein the gap comprises a thermal interface material.

20. The electronic package of claim 17, wherein a portion of the overmold body is arranged between the metal frame structure and the first electronic device.

21. The electronic package of claim 17, further comprising a second electronic device mounted on the first face of the substrate, wherein the first recess is arranged between the first electronic device and the second electronic device such that the metal frame structure forms the electromagnetic shield between the first electronic device and the second electronic device.

22. The electronic package of claim 21, further comprising a second recess that extends along a periphery of the first electronic device and the second electronic device such that the metal frame structure further forms the electromagnetic shield around the periphery of the first electronic device and the second electronic device.

23. The electronic package of claim 22, wherein the first recess is continuous with the second recess.

* * * * *